United States Patent [19]

Sattin

[11] Patent Number: 4,847,560
[45] Date of Patent: Jul. 11, 1989

[54] SIMULTANEOUS MULTISLICE-MULTIANGLE IMAGES WITHOUT SATURATION BANDS

[75] Inventor: William Sattin, Cleveland Heights, Ohio

[73] Assignee: Picker International, Inc., Highland Heights, Ohio

[21] Appl. No.: 234,319

[22] Filed: Aug. 19, 1988

Related U.S. Application Data

[63] Continuation-in-part of Ser. No. 897,118, Aug. 15, 1986, Pat. No. 4,774,466.

[51] Int. Cl.$^4$ ............................................. G01R 33/20
[52] U.S. Cl. ................................... 324/309; 324/312; 324/314
[58] Field of Search ............... 324/307, 309, 311, 312, 324/313, 314, 318

[56] References Cited

U.S. PATENT DOCUMENTS

| | | | |
|---|---|---|---|
| 4,510,448 | 4/1985 | Riedl | 324/309 |
| 4,649,347 | 3/1987 | Hwang et al. | 324/309 |
| 4,673,880 | 6/1987 | Compton et al. | 324/309 |
| 4,707,658 | 11/1987 | Frahm et al. | 324/309 |
| 4,710,716 | 12/1987 | Keren et al. | 324/309 |
| 4,746,863 | 5/1988 | Crooks et al. | 324/314 |

OTHER PUBLICATIONS

"Multiple-Angle, Variable-Interval, Nonorthogonal MRI" by Reicher, et al., AJR:147, Aug. 1988, pp. 363–366.

Primary Examiner—Stewart J. Levy
Assistant Examiner—Kevin D. O'Shea
Attorney, Agent, or Firm—Fay, Sharpe, Beall, Fagan, Minnich & McKee

[57] ABSTRACT

Radio frequency pulses (40, 50, 60) having tip angles in the range of 5° to 15° are applied concurrently with slice select gradient pulses (42, 52, 62) to tip a component of the magnetization into a transverse plane. Phase encode gradients (44, 54, 64) phase encode magnetic resonance echoes (48, 58, 68) which are collected in the presence of read gradients (46, 56, 66). The magnitude of components of the slice select, read, and phase encode gradients along three system axes (grad1, grad2, grad3) are different in conjunction with each echo such that each echo represents a view of data along a different slice through a region of interest. The tip angle ($\alpha$) and duration (t) between RF pulses are selected such that the magnetization of dipoles within the most recently selected slice regrows along the magnetic field axis until it is indistinguishable over integrated noise from the magnetization corresponding to other dipoles in the image region.

16 Claims, 2 Drawing Sheets

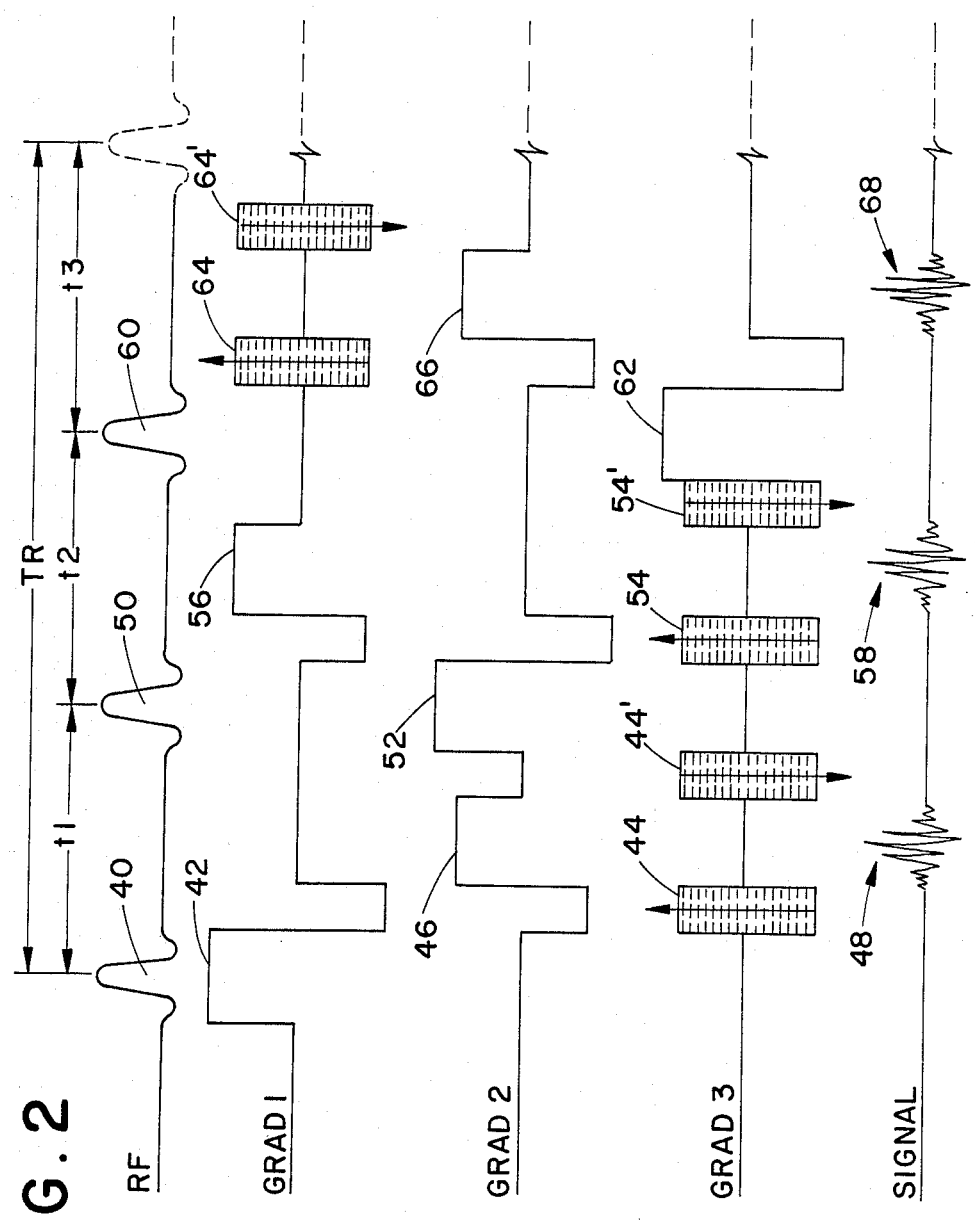

SIMULTANEOUS MULTISLICE-MULTIANGLE IMAGES WITHOUT SATURATION BANDS

This application is a continuation-in-part of U.S. application Ser. No. 897,118, filed Aug. 15, 1986, now U.S. Pat. No. 4,774,466.

BACKGROUND OF THE INVENTION

The present invention relates to the art of multislice, magnetic resonance imaging. It finds particular application in conjunction with obtaining intersecting multislice two dimensional orthogonal, medical diagnostic images and will be described with particular reference thereto. It is to be appreciated, however, that the invention is also applicable to quality assurance and other types of magnetic resonance imaging, to acquiring three dimensional intersecting images, and the like.

In the past, multislice orthogonal images have been collected by changing the slice select, phase encode, and read gradients for each magnetic resonance echo. However, the dipoles which were in two or more of the slices were subject to the RF pulse for both slices which saturated the slice intersection. The resultant images had saturation bands, normally black, along the area in which that image slice intersected one or more of the other image planes or slices.

One technique for eliminating the saturation bands was to select slices which intersected outside of the region of interest. This enabled two or more non-parallel slices to be imaged concurrently. However, the requirement that the slices intersect outside of the region of interest greatly limited the planes which were able to be selected.

Another drawback of these prior art techniques was that all images must have the same field of view and slice thickness.

The present invention provides a new and improved multislice, multiangle imaging technique without the saturation artifacts and other drawbacks set forth above.

SUMMARY OF THE INVENTION

In accordance with one aspect of the present invention, a method of magnetic resonance imaging is provided in which a plurality of slices intersect within a region of interest without saturation artifacts. A static magnetic field is provided through the region of interest along a magnetic field axis. After components of the magnetization of selected nuclei in a region of interest are tipped into a plane transverse to the magnetic field axis, the magnetization component along the magnetic field axis regrows and the component in the transverse plane shrinks.

At a first selected point in the regrowth of the magnetization along the magnetic field axis, the magnetization is tipped by a first tip angle to move a magnetization component into the transverse plane. The component in the transverse plane is caused to generate a magnetic resonance echo which forms a view of a first image representation. When the magnetization regrows along the magnetic field axis to a second selected point, the magnetization is tipped with a second tip angle. A second magnetic resonance echo is generated to produce data for a view of a second image. When the magnetization along the magnetic field axis regrows to a third preselected point, the magnetization is tipped by a third selected tip angle. A third magnetic resonance echo to provide the data for a view of a third image.

In accordance with a more limited aspect of the present invention, the first, second, and third selected magnetization regrowth points are sufficiently close to each other that they are substantially indistinguishable over system noise.

In accordance with another expression of this aspect, the difference between any two of the magnetization regrowth points is less than the system noise.

In accordance with a more limited aspect of the present invention, the tip angles are all less than 90° and at least the first and second tip angles are substantially the same. The last tip angle is preferably the same as well. However, if there is a longer duration between sequences, the last tip angle may be somewhat larger, enabling the last image to have different contrast.

In accordance with another more limited aspect of the present invention, the tip angle is sufficiently small that the longitudinal component of the magetization of all dipoles within the image region regrows to substantially the same point between RF tipping pulses, regardless whether or not each dipole was in a preceding slice. For imaging sequences in which the period between RF tipping pulses is much less than the T1 relaxation time of the dipoles, the tip angle is typically in the range of 5° to 15°. Of course, longer intervals between RF tipping pulses enable the tip angle to be somewhat longer and shorter times require the tip angle to somewhat smaller. The selected longitudinal magnetization regrowth points are within the level of system noise of being the same as each other.

One advantage of the present invention is that intersecting magnetic resonance images can be acquired simultaneously without saturation bands.

Another advantage of the present invention is that intersecting multislice two dimensional magnetic resonance images can be obtained without saturation bands. The slices may be orthogonal or oblique and may have different slice offsets.

Another advantage of the present invention is that the intersecting slices may have different fields of view and slice thicknesses.

Another advantage of the present invention is that it can be used with gradient nulling techniques to reduce motion artifacts.

Yet another advantage of the present invention is that intersecting three dimensional images can also be acquired without saturation artifacts.

Still further advantages of the present invention will become apparent to those of ordinary skill in the art upon reading and understanding the following detailed description of the preferred embodiments.

BRIEF DESCRIPTION OF THE DRAWINGS

The invention may take form in various steps and arrangements of steps or in various components or arrangements of components. The figures are only for illustrating a preferred embodiment and are not to be construed as limiting the invention.

DETAILED DESCRIPTION OF THE PREFERRED EMBODIMENT

Figure 1:
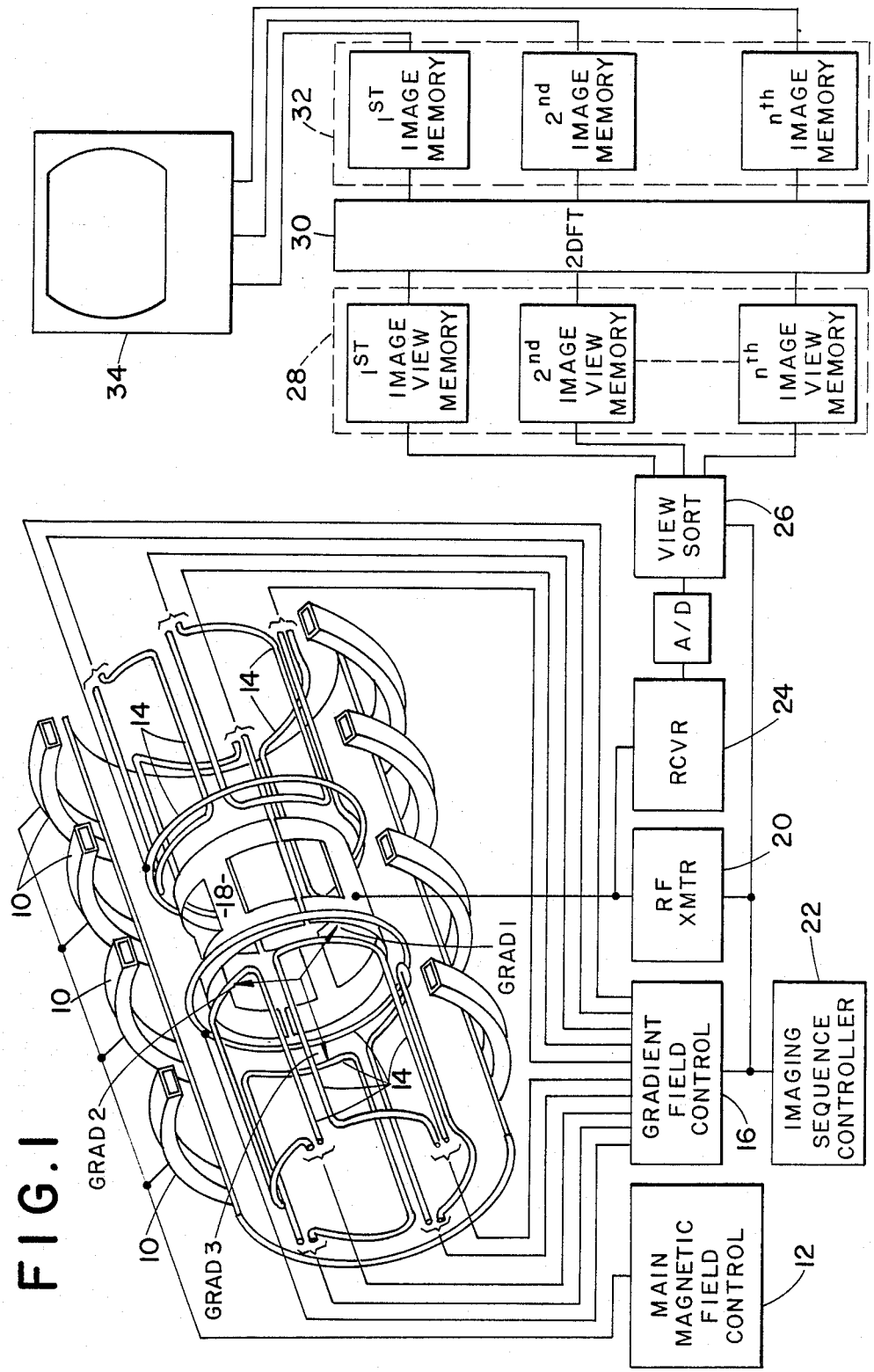
FIG. 1 is a diagrammatic illustration of a magnetic resonance imager for accumulating multislice data in accordance with the present invention; and, FIG. 2 is a diagrammatic illustration of a magnetic resonance pulse sequence in accordance with the present invention.

With reference to FIG. 1, magnets 10 under the control of a main magnet control means 12 generate a generally uniform static, magnetic field through an image region or region of interest. Gradient field coils 14 convert electrical pulses from a gradient field control means 16 into magnetic field gradients across the main magnetic field. In the preferred embodiment, the gradients are applied along three orthogonal axes and are denoted grad1, grad2, and grad3. One or more of the gradients perform the function of the slice select, read, and phase encode gradients in single slice imaging, depending on the angle of the slice(s) to be imaged.

Radio frequency pulses are transmitted into the examination region by radio frequency coils 18. An RF pulse generator or transmitter 20 formats each RF pulse with a selected shape and magnitude. Each RF pulse magnitude or scale value is selected to cause a corresponding tip angle of the magnetization of resonating dipoles in the image region, preferably a selectable angle between zero and 180°. A sequence controller 22 controls the qradient field control means 16 and the RF pulse generator 20 to produce selected imaging or other magnetic resonance sequences.

Magnetic resonance signals or echoes from the examination region are monitored by a receiver 24. Commonly, the data from each magnetic resonance echo is designated as one view of data. Each repetition of the imaging sequence produces one echo or view of data for each of the multiple slices being imaged. A view sorting means 26 sorts the view data received during each sequence among a plurality of view memory means 28. Each memory means corresponds the set of views corresponding to each imaged plane or slice. An image reconstruction means 30 such as an inverse two dimensional Fourier transform algorithm, transforms or reconstructs the view data into corresponding image representations for storage in corresponding image memory means 32. As is conventional in the art, a display means such as a video monitor 34 provides a video display corresponding to a selectable one or more of the image representations.

In the imaging sequence illustrated in FIG. 2, three orthogonal slices are generated along the gradient axes grad1, grad2, and grad3. A first RF pulse 40 with a tip angle $\alpha 1$ is applied in the presence of a slice select gradient 42. In the illustrated embodiment, the slice select gradient for the first echo or view is along grad1. A phase encode gradient 44 phase encodes the magnetization tipped from alignment with the longitudinal static magnetic field into the transverse plane. In the illustrated embodiment, the first phase encode gradient is applied along grad3. A read gradient 46 is applied along grad2 concurrently with a first magnetic resonance echo 48, a field echo in the illustrated embodiment. A phase encode gradient 44', equal in magnitude and opposite in sign or polarity to phase encode gradient 44, removes the phase encoding.

A second RF pulse 50 with a tip angle $\alpha 2$ is applied a time t1 after the first RF pulse 40. The second RF pulse is applied in the presence of a second slice select gradient 52, this time applied along the grad2 axis. A phase encode gradient 54 applied along the grad3 axis phase encodes the magnetization components rotated into the transverse plane by the second RF pulse. A read gradient 56 is applied concurrently with a second magnetic resonance echo 58 which represents one view of a second image representation along a second slice orthogonal to the first slice. A phase encode gradient 54', which is equal in magnitude and opposite in sign, removes the phase encoding applied by gradient 54.

A third RF pulse 60 with a tip angle $\alpha 3$ is applied a time t2 after the second RF pulse concurrently with a slice select gradient 62 applied along grad3. The magnetization component rotated into the transverse plane by the third RF pulse is phase encoded with a third phase encode gradient 64 along grad1. A third slice select gradient 66 along the grad2 axis is applied concurrently with a third magnetic resonance echo 68 representing one view of an image representation along a third slice. A phase encode gradient 64' removes the phase encoding applied by phase encode gradient 64. Fourth and additional RF pulses and slice select, gradient, and read gradients may be analogously applied to image additional images.

The sequence is repeated while the phase encode gradients step through each of the views for each of the image representations. A time t3 between the third or last images along more than three planes are collected and the first RF pulse of the next sequence may be longer than the time t between other RF pulses within the sequence.

Each RF pulse tips a component of the magnetization from parallel to the static magnetic field into a transverse plane. The magnetization component in the transverse plane decays while the longitudinal component regrows. If only a relatively small amount of magnetization is tipped into the transverse plane, i.e. a small tip angle, then the time for the longitudinal component to regrow to its value or size prior to the RF pulse is relatively short. As more magnetization is tipped into the transverse plane, i.e. the tip angle becomes larger, the regrowth time becomes correspondingly larger. Thus, both $\alpha$ and t influence the amount of magnetization along the longitudinal axis when the next RF pulse is applied.

If the longitudinal component of the magnetization has not regrown sufficiently before the next RF pulse is applied, then partial saturation occurs. A saturation band will appear in the image or view collected after the second echo unless there was sufficient regrowth along the longitudinal direction prior to the RF pulse. More specifically, the saturation band will appear unless the difference between signals from dipoles in the intersection between the slices and signals from dipoles in the rest of the sample is less than the total noise level. Stated another way, within the level of error attributable to integrated noise, the magnetization along the longitudinal axis appears to have regrown to the same point or size before each RF pulse.

It will be noted that both $\alpha$ and t influence this signal difference. By adjusting either $\alpha$ or t, the sequence can be adjusted to fulfill this criterion. The tip angle influences the amount of magnetization brought into the transverse plane, hence, the quantity of longitudinal magnetization that needs to be restored. The time t controls the length of time that longitudinal magnetization regrows, hence, the amount of regrowth. Although either $\alpha$ or t may be adjusted to fulfill the criterion, the value of t is often chosen or fixed due to other considerations. Specifically, t is commonly chosen to be much less than T1 such that the sequence is time efficient. Once t is selected or fixed, $\alpha$ becomes the free variable.

In the described field echo technique in which a human subject is imaged, α typically ranges from 5° to 15°.

The same criteria is set for third and additional echoes of the sequence. Note that if the magnetization regrows along the longitudinal axis to the same point, within the level of accuracy defined by rms noise, before each RF pulse, there will be no saturation band at the intersection of subsequent images.

Although the sequence of FIG. 2 produces orthogonal images, it is to be appreciated that images of other angles may be selected. For example, the plane of the first image slice may be rotated by applying another slice select gradient concurrently with slice select gradient 42. If the ratio of the slice select gradients is 1:1, the plane will be tipped to 45°, at 2:1, the plane will be tipped by 60°, at 0:1, by 90°, and so forth. Analogously, a further slice select gradient may be applied along grad3 to tip the plane relative to the third axis. By adjusting the relative size of these three pulses, planes of substantially any angle may be selected. Analogous adjustments may also be made to the phase encode and read gradients. For three dimensional images, phase encoding along one axis is applied within phase encoding along another axis. That is, a primary phase encode gradient is repeatedly applied along one axis as a secondary phase encode gradient along another axis is stepped over a preselected range of steps.

The magnitude of the magnetization rotated into the transverse plane is one determining factor for the contrast of the resultant image. If the time t3 between the last RF pulse of one sequence and the first RF pulse of the next sequence is longer than the time t1 or t2, then the last RF pulse may have a higher tip angle, hence, produce an image with different contrast. Analogously, the values of t can be altered to alter image contrast and to alter the length of each sequence cycle. For a fixed repeat time TR, altering the length of the single sequence cycle will change the number of image slices which can be obtained for repeat. As another option, the time from the RF excitation to the echo formation can be altered such that the fat and water signals are present with a selected phase relationship, e.g. fat and water in phase or fat and water out of phase.

As another alternative, the gradients applied in conjunction with each echo may be adjusted relative to each other to obtain a different field of view, different slice thicknesses, and independent slice offsets.

It is to be appreciated that the description of the invention using single slice field echo sequences is only by way of illustration. Other two and three dimensional imaging sequences may analogously be utilized. Gradient moment nulling techniques, conventional in the art, may be incorporated to reduce the effects of motion on resulting images.

The invention has been described with reference to the preferred embodiment. Obviously, modifications and alterations will occur to others upon reading and understanding the preceding specification. It is intended that the invention include all such alterations and modifications insofar as they come within the scope of the appended claims or the equivalents thereof.

Having thus described the preferred embodiment, the invention is now claimed to be:

1. A method of multislice, multiangle imaging without saturation bands, the method comprising:
   (a) generating a generally static magnetic field through a region of interest such that the magnetization of dipoles within the region of interest approaches an equilibrium value along the axis of the magnetic field;
   (b) when the magnetization along the magnetic field axis is at a first selected point, tipping a first selected fraction of the magnetization out of alignment with the magnetic field axis into a transverse plane, inducing the magnetization in the transverse plane to form a first magnetic resonance echo, sampling data during the first magnetic resonance echo to create a view of a first image representation, the magnetization regrowing with time along the magnetic field axis;
   (c) when the magnetization along the magnet field axis has grown to a second selected point, tipping a second selected fraction of the magnetization out of alignment with the magnetic field axis into the transverse plane, inducing the magnetization in the transverse plane to form a second magnetic resonance echo, sampling data during the second magnetic resonance echo to create a view of a second image representation, the magnetization regrowing with time along the magnetic field axis; and,
   (d) a difference between the first and selected points of magnetization regrowth along the magnetic field axis being less than integrated noise.

2. The method as set forth in claim 1 further including:
   when the magnetization along the magnet field axis has grown to a third selected point, tipping a third selected fraction of the magnetization out of alignment with the magnetic field axis into the transverse plane, inducing the magnetization in the transverse plane to form a third magnetic resonance echo, sampling data during the third magnetic resonance echo to create a view of a third image representation, the magnetization regrowing with time along the magnetic field axis.

3. The method as set forth in claim 2 wherein a time between the first and second tipping steps is the same as a time between the second and third tipping steps.

4. The method as set forth in claim 3 wherein the time between tipping steps is much less than T1.

5. The method as set forth in claim 3 further including adjusting at least the first and second tip angles to select a largest tip angle in which the second and third regrowth points each differ from the first regrowth point by less than the integrated noise.

6. The method as set forth in claim 2 further including times between the first and second tipping steps to select the largest tip angles in which the second and third regrowth points differ from the first regrowth point by less than the integrated noise.

7. The method as set forth in claim 3 wherein the first and second tip angles are the same.

8. The method as set forth in claim 7 wherein the first, second, and third tip angles are equal.

9. The method as set forth in claim 7 wherein the first and second tip angles are in the range of 5° to 15° for times between the tipping steps on the order of 10 ms to 50 ms.

10. The method as set forth in claim 3 wherein the tipping steps each include applying an RF pulse.

11. The method as set forth in claim 10 further including:
   applying slice select gradient components along at least one of three preselected axes concurrently with each RF pulse;

applying read gradient components along at least one of the three preselected axes concurrently with each echo; and, applying phase encode gradient components along at least one of the preselected axes between each RF pulse and resultant echo to phase encode the resultant echo.

12. The method as set forth in claim 11 further including after each echo, applying a phase encode gradient of equal magnitude and opposite polarity.

13. The method as set forth in claim 11 wherein the read, slice select, and phase encode gradients are each applied along different preselected axes such that the resultant images represent three mutually orthogonal slices.

14. The method as set forth in claim 11 wherein primary phase encode gradient components are applied along one axis concurrently with secondary phase encode gradient components along a second axis, whereby three dimensional image data is collected along at least one axis.

15. The method as set forth in claim 1 further including repeating step (c) at least one more time.

16. An apparatus for concurrently generating a plurality of image representations, each image representation representing one of a plurality of slices which intersect in a region of interest and without saturation bands, the apparatus comprising:

means for generating a static magnetic field along a magnetic field axis through a region of interest such that magnetization components of dipoles disposed within the region of interest regrow in alignment with the magnetic field axis;

a gradient field means for selectively causing read, slice select, and phase encode gradients along selectable directions relative to the magnetic field axis;

a radio frequency transmitter means for selectively applying radio frequency pulses having a tip angle in a range of 5° to 15° concurrently with the slice select gradients;

a radio frequency receiver for receiving a magnetic resonance echo signals concurrently with the slice select gradients;

a sequence control means for controlling the radio frequency transmitter means and gradient field means to apply a plurality of repetitions of a pulse sequence, each pulse sequence including a plurality of radio frequency pulses, which cause a plurality of magnetic resonance echoes each representing a view of a different image representation, the sequence control means repeating the sequence a plurality of times with different phase encode gradients such that a plurality of differently phase encoded views corresponding to each image representation are generated, the sequence control means causing the radio frequency pulses to be applied at an interval therebetween and causing each radio frequency pulse to have a tip angle such that the magnetization of dipoles within a most recently imaged slice regrows along the magnetic field axis to generally the same point as the magnetization of dipoles outside of the most recently imaged slice when each subsequent radio frequency pulse is applied;

a sorting means for sorting the views corresponding to each image representation into a corresponding one of a plurality of view memory means;

a transform means for selectively transforming the views from each view memory means into a corresponding image representation.

* * * * *